(12) United States Patent
Chien et al.

(10) Patent No.: US 6,426,304 B1
(45) Date of Patent: Jul. 30, 2002

(54) POST ETCH PHOTORESIST STRIP WITH HYDROGEN FOR ORGANOSILICATE GLASS LOW-κ ETCH APPLICATIONS

(75) Inventors: Ting Chien, Cupertino; Janet M. Flanner, Union City, both of CA (US); Ian Morey, Singapore (SG)

(73) Assignee: Lam Research Corporation, Fremont, CA (US)

( * ) Notice: Subject to any disclaimer, the term of this patent is extended or adjusted under 35 U.S.C. 154(b) by 27 days.

(21) Appl. No.: 09/608,251

(22) Filed: Jun. 30, 2000

(51) Int. Cl.$^7$ .................................... H01L 21/302
(52) U.S. Cl. ...................... 438/727; 438/725
(58) Field of Search ........................ 438/727, 725, 438/963, 715; 204/192.36

(56) References Cited

U.S. PATENT DOCUMENTS

| | | | |
|---|---|---|---|
| 5,624,582 A | * 4/1997 | Cain | 438/715 |
| 5,958,798 A | 9/1999 | Shields | 438/710 |
| 6,030,901 A | * 2/2000 | Hopper et al. | 438/711 |
| 6,080,529 A | 6/2000 | Ye et al. | 430/318 |
| 6,281,135 B1 | * 8/2001 | Han et al. | 438/725 |

FOREIGN PATENT DOCUMENTS

WO   WO 00/10199   2/2000 ......... H01L/21/311

OTHER PUBLICATIONS

Nguyen et al., "A Forming Gas Resist Strip Process for Use with Non–Etchback Low k Spin–on Polymers", Jun. 18–20, 1996 VMIC Conference, 1996–ISMIC–160/96/0147(c).
Louis et al., "Post Etch Cleaning of Low–k Dielectric Materials for Advanced Interconnects: Characterization and Process Optimization", Elsevier Microelectronic Engineering 41/42 (1998), pp. 415–418.
International Search Report (PCT), date mailed Mar. 1, 2002.

* cited by examiner

Primary Examiner—Caridad Everhart
(74) Attorney, Agent, or Firm—Beyer Weaver & Thomas, LLP

(57) ABSTRACT

Method for stripping photoresist from a semiconductor wafer including a layer of organosilicate dielectric. The method introduces a flow of hydrogen-containing gas to the wafer, and uses the hydrogen-containing gas to form a plasma in proximity with at least a portion of the wafer. The plasma is used to strip at least a portion of the photoresist from the wafer. Where the stripping of the photoresist from the semiconductor wafer is performed subsequent to an etching step performed on the wafer in an etch apparatus, the present invention in turn enables the stripping of the photoresist in situ within the etch apparatus. A surprising result of the present invention is that dramatically elevated concentrations of hydrogen gas not only enable high throughput strip rates, but that the utilization of these highly concentrated hydrogen gas mixtures can be performed in safety.

17 Claims, 6 Drawing Sheets

Total Flows (sccm)

| | HP (100% WAP control) | | | XLE (gap 1.30) | | Exelan (30% WAP control) | |
|---|---|---|---|---|---|---|---|
| | at 0% | at 50% | at 100% | Chamber | WAP | at 0% | at 100% |
| 200 | 41 | 56 | 87 | 24 | 60 | 57 | 75 |
| 400 | 72 | 104 | 159 | 40 | 102 | 102 | 135 |
| 600 | 98 | 143 | 222 | 56 | 140 | 139 | 187 |
| 800 | 123 | 180 | 279 | 68 | 174 | 173 | 234 |
| 1000 | 145 | 212 | 332 | 80 | 204 | | 272 |
| 1200 | 163 | | 372 | 96 | 234 | | |
| 1400 | 180 | 263 | 410 | 108 | 263 | | |
| 1600 | 197 | | 447 | 122 | 285 | | |
| 1800 | 214 | | 483 | 136 | 311 | | |
| 2000 | 231 | 332 | * | 150 | 333 | | |
| 2200 | 250 | | | 166 | 362 | | |
| 2400 | 268 | | | 184 | 383 | | |
| 2600 | 287 | 407 | | 202 | 414 | | |

WAP

Fig 2

| test | purpose | pressure | toppw | botpw | H2 | N2 | CF4 | He | ER | sigma | +/- unif |
|---|---|---|---|---|---|---|---|---|---|---|---|
| 1 | power | 200 | 500 | 500 | 180 | 180 | 0 | 15 | 2354 | 6.81 | 10.54 |
| 2 | power | 200 | 1250 | 1500 | 180 | 180 | 0 | 15 | 4522 | 11 | 15.77 |
| 3 | control | 200 | 750 | 1000 | 180 | 180 | 0 | 15 | 3408 | 7.29 | 10.21 |
| 4 | ratio | 200 | 750 | 1000 | 180 | 90 | 0 | 15 | 2806 | 5.5 | 7.84 |
| 5 | ratio | 200 | 750 | 1000 | 90 | 180 | 0 | 15 | 3060 | 7.21 | 10.75 |
| 6 | total flow | 200 | 750 | 1000 | 100 | 100 | 0 | 15 | 2644 | 5.96 | 8.51 |
| 7 | total flow | 500 | 750 | 1000 | 180 | 180 | 0 | 15 | 3630 | 6.66 | 8.65 |
| 8 | high flow | 120 | 500 | 500 | 800 | 800 | 0 | 15 | 3666 | 5.02 | 6.67 |
| 9 | high flow | 120 | 1250 | 1500 | 800 | 800 | 0 | 15 | 7539 | 6.38 | 8.06 |
| 10 | high flow | 120 | 500 | 500 | 800 | 800 | 0 | 15 | 4000 | 4.59 | 7.00 |
| 11 | He | 120 | 500 | 500 | 800 | 800 | 0 | 8 | 3824 | 5.14 | 7.14 |
| 12 | He | 120 | 500 | 500 | 800 | 800 | 0 | 2 | 4101 | 3.97 | 4.88 |
| 13 | ratio | 120 | 500 | 500 | 100 | 800 | 0 | 15 | 3104 | 4.82 | 8.49 |

Fig 4A

| Factor | ER change (Å/min) | condition | Fixed factors |
|---|---|---|---|
| H2/N2 ratio | -254 | 0.5 -> 2.0 | total=270, pressure=200, power 750/1000 |
| H2+N2 total | 764 | 200 -> 360 | ratio=1:1, pressure=200, power 750/1001 |
| pressure | 222 | 200 -> 500 | ratio=1:1, total=380, power 750/1002 |
| power (top/bot) | 1054 | 500/500->750/1000 | ratio=1:1, total=380, pressure=200 |
| | 1114 | 750/1000->1250/1500 | |
| flow+pressure | 1312 | 360sccm->1600 & 200mT->120 | power 500/500, ratio=1:1 |
| | 3016 | 360sccm->1600 & 200mT->120 | power 1250/1500, ratio=1:1 |
| backside He | <200 | 15T-->8T-->2T | power 500/500, ratio=1:1, H2+N2=1600 |

Fig 4B

POST ETCH PHOTORESIST STRIP WITH HYDROGEN FOR ORGANOSILICATE GLASS LOW-κ ETCH APPLICATIONS

FIELD OF THE INVENTION

The present invention relates to semiconductor manufacture. More particularly, the present invention relates to the in-situ stripping of photoresist from a semiconductor wafer, the wafer including at least one layer of organosilicate low-κ dielectric, during etching of the wafer.

BACKGROUND OF THE INVENTION

Integrated circuits use dielectric layers, which have typically been formed from silicon dioxide, $SiO_2$, to insulate conductive lines on various layers of a semiconductor structure. As semiconductor circuits become faster and more compact, operating frequencies increase and the distances between the conductive lines within the semiconductor device decrease. This introduces an increased level of coupling capacitance to the circuit, which has the drawback of slowing the operation of the semiconductor device. Therefore, it has become important to use dielectric layers that are capable of effectively insulating conductive lines against such increasing coupling capacitance levels.

In general, the coupling capacitance in an integrated circuit is directly proportional to the dielectric constant, κ, of the material used to form the dielectric layers. As noted above, the dielectric layers in conventional integrated circuits have traditionally been formed of $SiO_2$, which has a dielectric constant of about 4.0. As a consequence of the increasing line densities and operating frequencies in semiconductor devices, dielectric layers formed of $SiO_2$ may not effectively insulate the conductive lines to the extent required to avoid increased coupling capacitance levels.

In an effort to reduce the coupling capacitance levels in integrated circuits, the semiconductor industry has engaged in research to develop materials having a dielectric constant lower than that of $SiO_2$, which materials are suitable for use in forming the dielectric layers in integrated circuits. To date, a number of promising materials, which are sometimes referred to as "low-$\mu$ materials", have been developed. Many of these new dielectrics are organic compounds.

LOW-κ materials include, but are specifically not limited to: benzocyclobutene or BCB; Flare™ manufactured by Allied Signal® of Morristown, N.J., a division of Honeywell, Inc., Minneapolis, Minn.; one or more of the Parylene dimers available from Union Carbide® Corporation, Danbury CT; polytetrafluoroethylene or PTFE; and SiLK®. One PTFE suitable for IC dielectric application is SPEEDFILM™, available from W. L. Gore & Associates, Inc, Newark, Del. SiLK®, available from the Dow® Chemical Company, Midland, Mich., is a silicon-free BCB.

One interesting class of organic low-κ materials are compounds including organosilicate glass, or OSG. By way of example, but not limitation, such organosilicate dielectrics include CORAL™ from Novellus of San Jose, Calif.; Black Diamond™ from Applied Materials of Santa Clara, Calif.; Sumika Film® available from Sumitomo Chemical America, Inc., Santa Clara, Calif., and HOSP™ from Allied Signal of Morristown, N.J. Organosilicate glass materials have carbon and hydrogen atoms incorporated into the silicon dioxide lattice which lowers the dielectric constant of the material.

During semiconductor wafer processing, features of the semiconductor device are defined in the wafer using well-known patterning and etching processes. In these processes a photoresist (PR) material is deposited on the wafer and then is exposed to light filtered by a reticle. The reticle is generally a glass plate that is patterned with exemplary feature geometries that blocked light from propagating through the reticle.

After passing through the reticle, the light contacts the surface of the photoresist material. The light changes the chemical composition of the photoresist material such that a developer can remove a portion of the photoresist material. In the case of positive photoresist materials the exposed regions are removed, and in the case of negative photoresist materials the unexposed regions are removed. Thereafter the wafer is etched to remove the underlying material from the areas that are no longer protected by the photoresist material and thereby define the desired features in the wafer. Low-κ organic polymers in general can be etched by oxidation (e.g. oxygen-based) or reduction (e.g. hydrogen-based) chemical processes. OSG dielectrics may be advantageously etched using chemistries somewhat similar to oxide etch chemistries. OSG etch chemistries typically require etchant gasses with lower polymerization potential than straight oxide etching. This is necessary to account for the organic component in OSG films.

The etching of dielectrics may be advantageously accomplished in a dual-frequency capacitively-coupled, (DFC) dielectric etch system. One such is Lam® Research model 4520XLE™, available from Lam® Research Corporation, Fremont Calif. The 4520XLE™ system processes an extremely comprehensive dielectric etch portfolio in one system. Processes include contacts and vias, bilevel contacts, borderless contacts, nitride and oxide spacers, and passivation.

Advanced etch systems like the 4520XLE™ perform several processes in the same system. By performing many different semiconductor fabrication steps in a single system, wafer throughput can be increased. Even further advanced systems contemplate the performance of additional steps within the same equipment. Again by way of example, but not limitation, Lam® Research Corporation's Exelan™ system is a dry etch system capable of performing many process steps in a single apparatus. Exelan™ enables hardmask open, inorganic and organic ARC etch, and photoresist strip to be performed in situ with a single chamber. This system's extensive process portfolio includes all dual damascene structures, contacts, vias, spacers, and passivation etch in doped and undoped oxides and low-κ dielectrics required in the sub-0.18 micron environment. Of course, the principles enumerated herein may be implemented in wide variety of semiconductor fabrication systems, and these principles specifically contemplate all such alternatives.

As used herein, the term in situ refers to one or more processes performed on a given substrate, such as a silicon wafer, in the same piece of semiconductor fabrication equipment without removing the substrate from the equipment.

During fabrication of a semiconductor device, it is necessary during the repeated patterning, etching, and deposition of the various film layers which make up the device to remove the patterned photoresist following an etching or deposition step. While a number of photoresist removal technologies and methods have been implemented, in order to maintain the high throughput required by today's semiconductor manufacturers, the stripping of photoresist from semiconductor wafers within the etching equipment is highly desirable. As discussed, some advanced semiconductor etching devices provide the capability of performing multiple processes in situ within a single device. The normal procedure for doing such an in situ post etch photoresist strip involves using oxygen in the strip process. The use of oxygen with OSG materials is, however, problematic.

Because OSG materials are basically organically doped oxides, most current photoresist materials tend to have similar chemical characteristics with the organic component of OSG material. Accordingly, when utilizing a known oxygen-based methodology to remove organic material such as photoresist from the cap plate at the wafer's surface, known $O_2$ strip processes have the capability of removing organic material not only from the surface of the wafer, but potentially may also deleteriously remove organic material from the sidewall of the etched feature, or any other exposed surface. Moreover, OSG materials are susceptible to oxidation when exposed to oxygen plasma. The oxygen removes carbon and hydrogen from the OSG film, thereby rendering the films unstable and causing the dielectric constant of the film to increase.

Traditionally, etching and photoresist (PR) stripping were conducted in separate apparatus. To maximize system throughput, it would make sense to proceed from etching to PR strip in the same system. Indeed, if the two processes were performed in the same reaction vessel this would result in even greater increases in process efficiency. This leads to an interesting thought: could a system be designed in such a way that not only is etching and PR stripping conducted in the same chamber in the same system, but that these two processes be performed without de-energizing the plasma used for the etch step and utilizing it for the PR strip?

Hydrogen-based photoresist stripping has been performed in the past, typically with a barrel ash. Because of concerns for the safety of the process, this hydrogen based PR strip was typically performed at relatively low hydrogen concentrations in a nitrogen diluent, usually with hydrogen concentrations in the range of 4 to 5 percent.

What is desired is a methodology for performing dry photoresist stripping of OSG materials utilizing a hydrogen-based stripping process.

What is also desired is the methodology be practicable without the concomitant degradation in the dielectric performance of OSG materials occasioned by the use of known oxygen-based photoresist strip methodologies.

In order to maintain a high wafer throughput, what is also desirable is that the methodology be capable of being performed in situ within the fabrication equipment utilized to form the wafer.

Finally, it is desirable that the process be performed with either no or minimal post-strip residue remaining on the film surface, post-strip.

These and other features of the present invention will be described in more detail in the section entitled detailed description of the preferred embodiments and in conjunction with the following figures.

SUMMARY OF THE INVENTION

The present invention teaches a method for stripping photoresist from a semiconductor wafer including a layer of organosilicate dielectric. Following an etch step, the method introduces a flow of hydrogen-containing gas to the wafer, and uses the hydrogen-containing gas to form a plasma in proximity with at least a portion of the wafer. The plasma is used to strip at least a portion of the photoresist from the wafer. Where the stripping of the photoresist from the semiconductor wafer is performed subsequent to an etching step performed on the wafer in an etch apparatus, the present invention in turn enables the stripping of the photoresist in situ within the etch apparatus.

Prior hydrogen-based stripping efforts utilized low concentrations of hydrogen gas within a diluent gas, resulting in generally poor strip rates. Low hydrogen concentrations were evidently thought necessary for safety reasons. A surprising result of the research leading to the making of the present invention is that dramatically elevated concentrations of hydrogen in the strip or etchant gas not only enable high throughput strip rates, but the utilization of these highly concentrated hydrogen gas mixtures can be performed in safety.

These and other advantages of the present invention will become apparent upon reading the following detailed descriptions and studying the various figures of the Drawing.

BRIEF DESCRIPTION OF THE DRAWING

For more complete understanding of the present invention, reference is made to the accompanying Drawing in the following Detailed Description of the Preferred Embodiments. In the drawing:

FIG. 2 is a table detailing the relationship between gas flows and chamber pressure for three dry etch systems.

FIG. 4A is a table detailing several "low-flow" hydrogen-based photoresist tests.

FIG. 4B is a table summarizing the results of the tests detailed in FIG. 4A.

Figure 1:
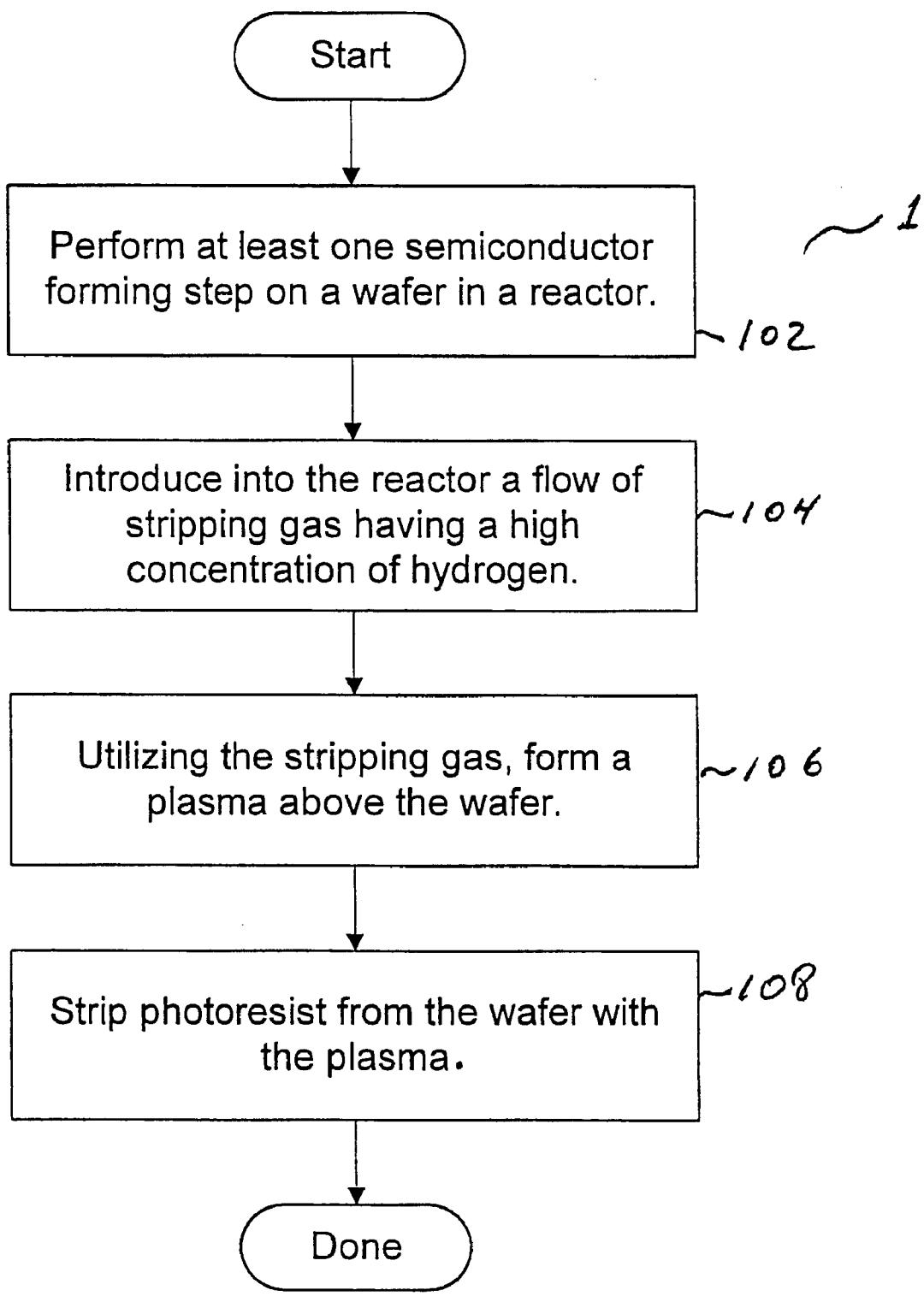
FIG. 1 is an overview flowchart of a process for removing photoresist from a semiconductor wafer including a layer of OSG dielectric.

Reference numbers refer to the same or equivalent parts of the invention throughout the several figures of the Drawing.

DETAILED DESCRIPTION OF THE PREFERRED EMBODIMENTS

The present invention teaches an in situ process for stripping photoresist from a semiconductor wafer formed with at least one layer of OSG dielectric, utilizing a reduction reaction implemented by a plasma formed within an etching apparatus. The plasma is formed from a flow of a gas mixture having a relatively high hydrogen-concentration.

Having reference now to FIG. 1, according to one embodiment of the present invention, there is presented a method 1, for stripping photoresist from a semiconductor wafer incorporating at least one layer of organosilicate dielectric. A semiconductor wafer formed with at least one layer of OSG is placed in the reaction vessel of a dual-frequency capacitively-coupled, (DFC) dielectric etch system. One such is Lam® Research model 4520XLE™, available from Lam® Research Corporation, Fremont Calif. At step 102, at least one semiconductor fabricating or forming step is performed on the wafer. By way of example, but not limitation, such forming or fabricating steps include photoresist patterning, etching, and deposition. Following the fabrication step, at step 104 a flow of photoresist stripping etchant gas is introduced into the reaction vessel. The photoresist stripping gas is a mixture of gases containing a substantially inert diluent, for instance nitrogen, and hydrogen. Alternative diluents may, with equal facility, be implemented. Preferably, the concentration of hydrogen within the stripping gas is in the range of about 10 percent to about 60 percent. More preferably, the concentration of hydrogen within the stripping gas is approximately 50 percent.

The stripping gas is maintained within the reaction vessel at a pressure preferentially in the range of about 80 mTorr to about 1000 mTorr. At step 106, a plasma is formed above the wafer by the duel frequency dielectric etch system operating at 2 MHz and 27 MHz. The power applied to the plasma at each frequency is generally in the range of about 100 to about 2000 watts. Preferably in the range of about 500 to about 1500 watts. The power level applied in conjunction with each frequency in the duel frequency system may differ.

Utilizing the plasma, photoresist is stripped at step 108 from the wafer, without damage to the organosilicate dielectric, and without the dielectric properties of the organosilicate. Stripping gas flows are maintained at high flow rates in order to increase the ash rate. Total gas flows in the range of 2000 to 3000 sccm and even higher are contemplated by the principles of the present invention.

The present invention contemplates varying a number of process parameters to achieve satisfactory results on a wide variety of wafer stacks to effect a wide variety of semiconductor design. Various factors including desired effect, throughput, and system capabilities will define optimal combinations of process parameters to accomplish the desired design. Each of the combinations so utilized is specifically contemplated by the present invention.

According to a first preferred embodiment, a silicon wafer substrate having between 0.1 and 20 kÅ OSG, for instance Novellus Coral, deposited thereon, and more preferably between 1 and 15 kÅ, and more preferably still between 3 and 8 kÅ is provided. Over the OSG is deposited a layer of deep-UV photoresist, for instance a deep-UV photoresist from Arch Chemicals. This layer may be from 0.5 to 20 kÅ in thickness, more preferably from around 1 to 15 kÅ in thickness, and more preferably still, from about 5 to 8 Kå in thickness. As is known by those having ordinary skill in the art, intervening layers may be interposed between the substrate and the OSG and between the OSG and the photoresist. Each of these alternatives is contemplated by the present invention.

The wafer is placed in a semiconductor manufacturing system, for instance a Lamg Research model 4520XLE™ dual-frequency capacitively-coupled, (DFC) dielectric etch system. One or more semiconductor manufacturing steps may be optionally performed at this point. These steps include, but are specifically not limited to patterning, etching, deposition, planarization, doping, metalization, and other semiconductor forming steps well known to those having ordinary skill in the art. Substantially all the photoresist is then stripped from the wafer as follows: The wafer is placed in a reaction chamber in the etch system. Dual frequency power at 2 and 27 MHz is applied to the system at power levels of 1000 W top and 2000 W bottom. Alternative frequencies and powers may be utilized. By way of illustration but not limitation, powers from about 200 W to about 2000 W may be implemented. A flow of $H_2/N_2$ etchant gas is then introduced into the reaction chamber and a plasma is struck. In this embodiment partial $H_2/,N_2$ flows of 550 sccm and 550 sccm respectively are used, resulting in a 1:1 or 50%/50% mixture of $H_2/N_2$. Alternative partial flows and resultant concentrations may be implemented. By way of illustration, but not limitation, these concentrations may be from 20% to 80% $H_2$ and from 80% to 20% $N_2$. Alternative diluents, known to those having ordinary skill in the art may also be used.

Reaction chamber pressure in this embodiment is set at 1 Torr. In this embodiment, this results in a wafer area pressure, or WAP, of 1 Torr. This direct relationship does not always attain. See FIG. 2. Alternatively, the present invention contemplates chamber pressures from around 82 mTorr to about 1 Torr, resulting in WAPs of around 200 mTorr to about 1 Torr.

Backside cooling He flows are set at about 15 Torr. Alternatively, substantially any backside cooling flow and gas may be utilized which does not adversely affect the semiconductor manufacture process. Such lower electrode temperatures are generally in the range of about −10° C. to about +40° C. In this preferred embodiment coolant flows of He were set to maintain bottom electrode temperature between about +20° C. and about +30° C. He coolant flows were changed when the manufacturing process changed in this embodiment from etching to PR stripping by reducing the coolant flow during PR strip from the coolant flow utilized during a previous etching step. This enabled the system to maintain electrode temperature while still providing the change in wafer temperature needed to optimize photoresist stripping.

Figure 3:
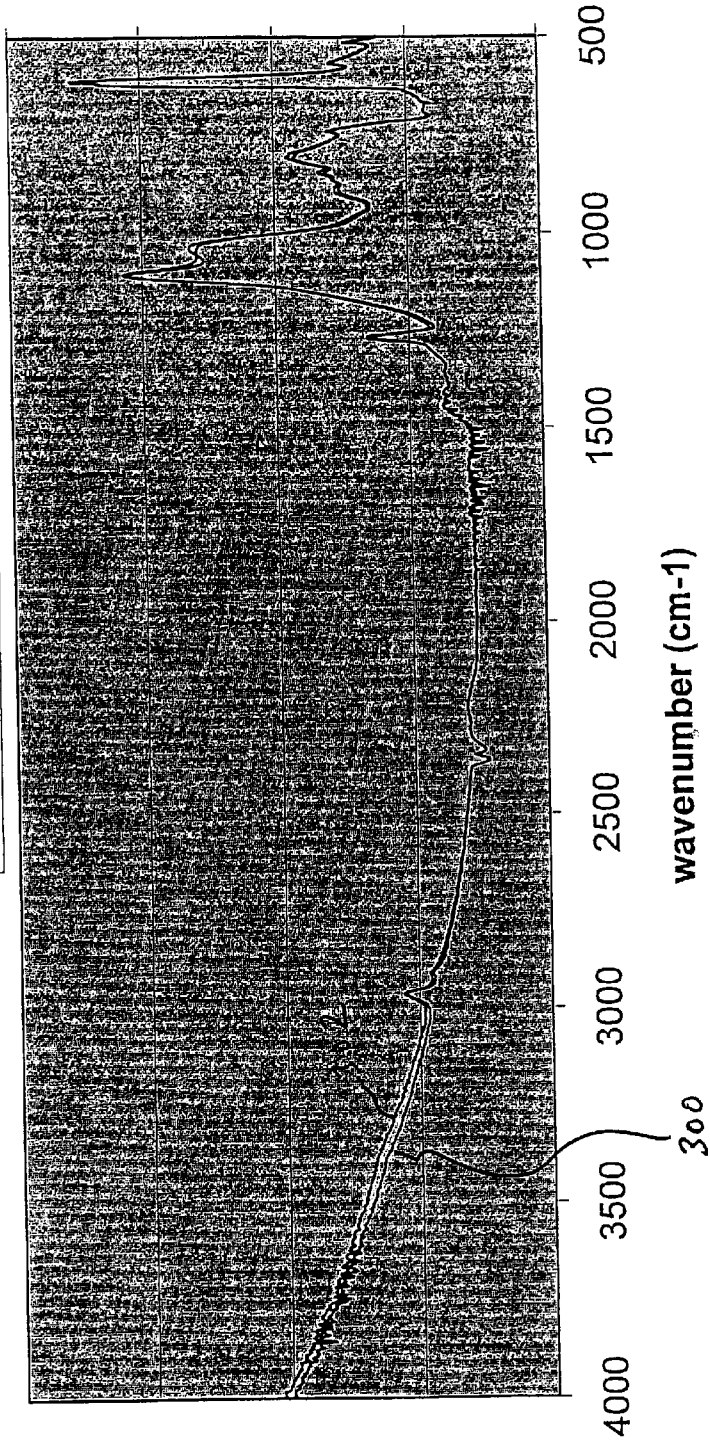
FIG. 3 is a graph of two FTIR spectrographic traces on a sample wafer incorporating an OSG dielectric, showing the changes to the dielectric as a result of the stripping taught herein.

The effects of the PR stripping taught by the present invention on OSG composition are shown having reference to FIG. 3 A first FTIR spectrographic reading is taken on a Novellus Coral film prior to a PR stripping evolution as previously detailed, and the resultant trace is shown at 300. Following PR strip, a second reading is taken and the resultant trace, 302, plotted over initial trace 300. As shown, the two traces are substantially co-linear showing nowhere a change greater than about 2.5% between the original composition and the composition following PR strip. This is proof that the present invention provides an effective, efficient PR strip for semiconductors utilizing OSG dielectrics with negligible change to composition of the OSG.

Where the previously defined stripping process follows another semiconductor manufacturing step requiring the use of a plasma, for instance an etching step, the methodology defined herein enables the change from etching to photoresist strip without recourse to breaking vacuum within the reaction vessel. Instead, the process of the present invention contemplates that etchant flows will be altered from the etching gas flow to the photoresist strip gas flow within the same reaction vessel. Optionally, wafer backside cooling may be altered to provide an optimal wafer temperature to effect PR strip.

In a second preferred embodiment, significantly increased $H_2/N_2$ flows are utilized. In this embodiment, chamber pressure was set at around 500 mTorr resulting in a WAP of around 680 mTorr. Power was set at 750 W/1000 W top and bottom, respectively. $H_2$ flow was set at 800 sccm and $N_2$ at 3200 sccm. This resulted in an ER of about 7072 Å/min.

In a third preferred embodiment, significantly increased $H_2/N_2$ flows are again utilized. In this embodiment, chamber pressure was set at around 800 mTorr resulting in a WAP of around 980 mTorr. Power was set at 750 W/1000 W top and bottom, respectively. $H_2$ flow was set at 800 sccm and $N_2$ at 4200 sccm. This resulted in an ER of about 6700 Å/min.

In a fourth preferred embodiment, significantly increased $H_2/,N_2$ flows are once again utilized. In this embodiment chamber pressure was set at around 490 mTorr resulting in a WAP of around 690 mTorr. Power was set at 750 W/1000 W top and bottom, respectively. $H_2$ flow was set at 600 sccm and $N_2$ at 3200 sccm. This resulted in an ER of about 6786 Å/min.

In order to investigate the effects of varying several of the process parameters of the present invention, a series of test wafers were prepared and processed. The silicon test wafers comprised wafer stacks including a layer of OSG dielectric and a layer of patterned Deep-UV photoresist. One dielectric tested was Novellus' Coral. Deep-UV photoresists are available from Arch Chemicals, Inc., North Kingstown, R.I., among others. Several of the process variables of the present invention were altered to determine their effect on etch rate or ER, residue formation, as well as the effect of the photoresist process on the properties of the dielectric. Tests were conducted in either a Lam® Research Corporation 4520XLE™ or Exelan™ DFC dry etch system with varying plasma power levels, hydrogen-diluent ratios, total etchant flows, pressures, and wafer backside He coolant flows. The results of these tests are presented having reference to FIGS. 4A–6B.

Referring now to FIG. 4A, the results of varying several of process variables of the hydrogen-based photoresist strip of the present invention are detailed. Tests 1 and 2 tested varying plasma energy during PR strip. In test 1 top and bottom powers were identical at 500 W each. In test 2, the top power was increased to 1250 W and bottom to 1500 W. In both tests 1 and 2 chamber pressure was set at 200 mTorr, hydrogen and diluent ($N_2$) flows were maintained at 180 sccm, and He wafer coolant flow was stabilized at 15 Torr. The etch rate for the low power test was 2354 Å/min, while ER for the higher power settings was 4522 Å/min. A control run at 750 W and 1000 W top and bottom respectively provided an ER of 3408 Å/min.

The effects of altering the H2/N2 ratio was next studied in tests 4 and 5. In both tests chamber pressure was constant at 200 mTorr, top and bottom power levels were set at 750 and 1000 respectively, and He backside coolant flow was set at 15 sccm. In test 4 the $H_2$ flow was set at 180 sccm and the $N_2$ at 90 sccm. Test 5 reversed these partial flows. In test 4 an ER of 2806 Å/min was attained. In test 5 this increased to 3060 Å/min.

Tests 6 and 7 explored the role of increasing pressures and flows. In test 6 a chamber pressure of 200 mTorr was maintained with partial $H_2$ and $N_2$ gas flows equalized at 100 sccm. An ER of 2644 Å/min was attained. Test 7 increased chamber pressure to 500 mTorr, and $H_2$ and $N_2$ gas flows to 180 sccm, attaining an etch rate of 3630.

Tests 8–10 tested the effects of increased total etchant gas flows. In tests 8 and 10 chamber pressure was set at 120 mTorr, top and bottom power levels set at 500 W each, and partial $H_2$ and $N_2$ gas flows equalized at 800 sccm each. These tests achieved ERs of 3666 and 4000 Å/min. In test 9 all process variables were maintained except that top and bottom power levels were increased to 1250 and 1500 respectively. This achieved the highest ER of the test series, 7539 Å/min.

Tests 11 and 12 investigated the role of He backside cooling. In each of these tests chamber pressure was set at 120 mTorr, top and bottom power to 500 W each, and $H_2$ and $N_2$ gas flows equalized at 800 sccm each. In test 11 He backside coolant flow was reduced to 8 sccm from the standard 15 sccm used for all previous tests. The resultant increased temperature provided an ER of 3824 Å/min, an increase of 158 Å/min over test 8. In test 12 the backside coolant flow was further reduced to 2 sccm, further increasing wafer temperature and resulting in an ER of 4101 Å/min, an increase of 435 Å/min over test 8.

Finally, at test 13, partial $H_2$ flow was reduced from 800 sccm as in test 8 to 100 sccm. This resulted in a concomitant reduction in ER from 3666 to 3104.

Having reference to FIG. 4B, these test results are summarized as follows: reducing $H_2/N_2$ ratios resulted in a concomitant slight reduction in ER, while increasing total $H_2/N_2$ flows resulted in significant increases in ER. Increases in chamber pressure resulted in modest gains in ER. Increased top and bottom power levels were associated with significantly increased ERs. The greatest ER increases were attained by high gas flows and pressures. Altering backside cooling showed a slight negative correlation between increased coolant flows, i.e. lower wafer temperatures, and lower ERs. The effects of chamber pressure and plasma power levels are further shown having reference to FIGS. 5A–C and 6A–B. At FIG. 5A a test wafer as previously described was stripped utilizing partial $H_2/N_2$ flows of 550 sccm each, and plasma power levels of 500 W, top and bottom. chamber pressure was at 82 mTorr. Generally good PR strip was attained with acceptable levels of residue.

Figure 5B:
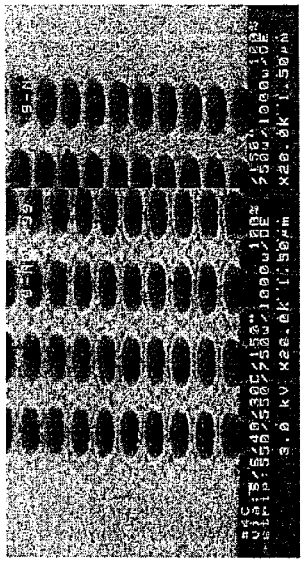
FIG. 5B is an SEM photomicrograph showing a test wafer cleared utilizing a hydrogen-based strip applied at 82 mTorr chamber pressure and top and bottom etch powers of 750 watts and 1000 watts, respectively.
Figure 5A:
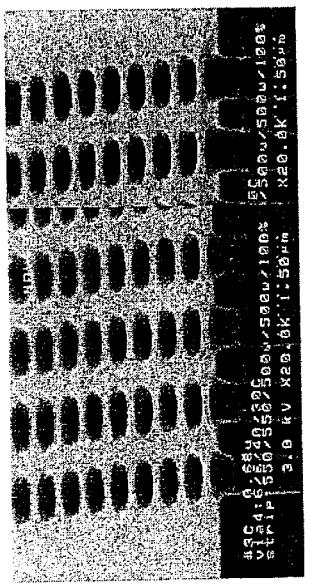
FIG. 5A is an SEM photomicrograph showing a test wafer cleared utilizing a hydrogen-based strip applied at 82 mTorr chamber pressure and top and bottom etch powers of 500 watts and 500 watts, respectively.
Figure 5C:
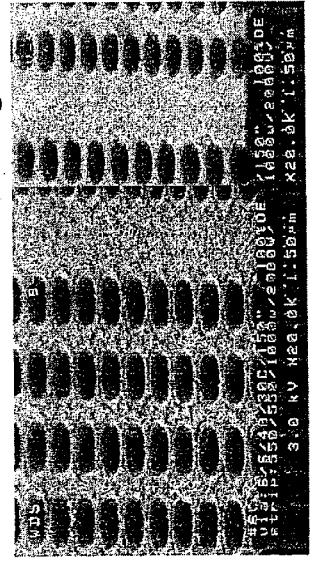
FIG. 5C is an SEM photomicrograph showing a test wafer cleared utilizing a hydrogen-based strip applied at 82 mTorr chamber pressure and top and bottom etch powers of 1000 watts and 2000 watts, respectively.

At FIG. 5B the same test was conducted, this time increasing top and bottom plasma levels to 750 W and 1000 W, respectively. This resulted in moderate residue formation, as shown. Greater amounts of residue were formed at the center of the wafer than at the edge.

At FIG. 5C, power was again increased to 1000 W and 2000 W, top and bottom respectively. More significant residue was formed, with again increased residue levels towards the center of the wafer.

Figure 6B:
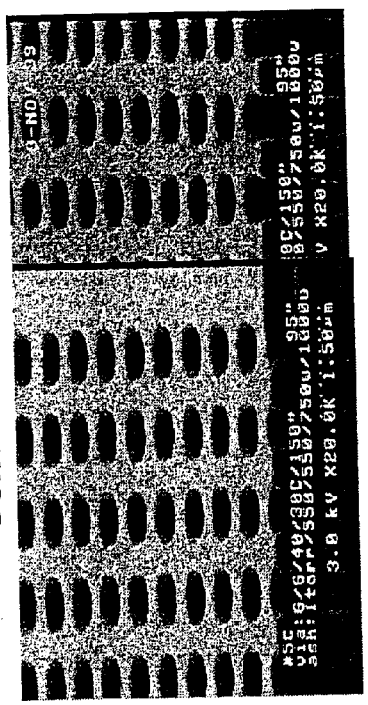
FIG. 6B is an SEM photomicrograph showing a test wafer cleared utilizing a hydrogen-based strip applied at 1 Torr chamber pressure and top and bottom etch powers of 750 watts and 1000 watts, respectively.
Figure 6A:
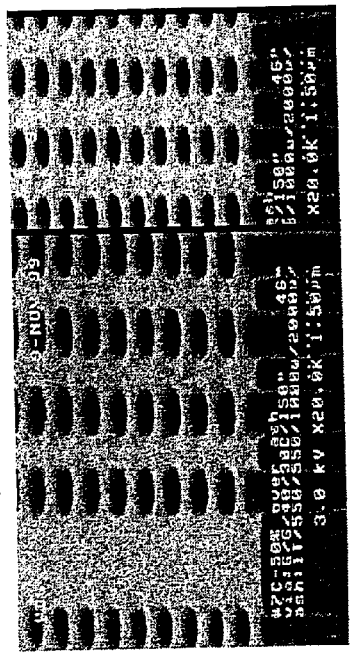
FIG. 6A is an SEM photomicrograph showing a test wafer cleared utilizing a hydrogen-based strip applied at 1 Torr chamber pressure and top and bottom etch powers of 1000 watts and 2000 watts, respectively.

At FIG. 6A, chamber pressure is increased to 1 Torr and power increased to 1000 W and 2000 W top and bottom respectively. This results in a high strip rate with minimal residue at both center and edge of the test wafer. Reducing the power level to 750 W and 1000 W top and bottom results in a moderately high strip rate with minimal residue at both center and edge of the test wafer. Reducing the power level to 750 W and 1000 W top and bottom results in a moderately high strip rate with minimal residue formation.

At FIG. 6B chamber pressure remains at 1 Torr while power is decreased to 750 W and 1000 W, top and bottom respectively. While very satisfactory, the reduction in power resulted in increased process times and slightly greater residue than the previously illustrated embodiment.

Finally, at FIG. 2, the relationship between WAP and total gas flows for three different Lam® Research systems is summarized. The Lam® HP™ utilizes 100% pressure control. For this system, WAP was determined at the 0%, 50%, and 100% confinement ring positions. In the XLE™, with the system's throttle valve fully open, WAP was determined at an electrode gap of 1.30 cm. The relationship between WAP and total gas flows for Exelan system was conducted at the 0% and 100% confinement ring positions.

The present invention has been particularly shown and described with respect to certain preferred embodiments of features thereof. However, it should be readily apparent to those of ordinary skill in the art that various changes and modifications in form and detail may be made without departing from the spirit and scope of the invention as set forth in the appended claims. In particular, the principles of the present invention specifically contemplate the incorporation of any of several film layers known to those having skill in the art, and one or more of the various features and advantages taught herein on a wide variety of semiconductor wafers formed with that least one layer of OSG dielectric. Moreover, the principles enumerated herein teach a wide range of hydrogen titers, stripping gas pressures and flow rates, plasma power levels, wafer temperatures, and plasma frequencies. Each of these alternatives is specifically contemplated by the principles of the present invention.

What is claimed is:

1. A method for stripping photoresist from a semiconductor wafer, the wafer including a layer of organosilicate dielectric, the method comprising:
   introducing the wafer into a semiconductor fabrication system including at least one reaction vessel;
   introducing a flow of reduction-producing gas into the reaction vessel, wherein the introduction of the reduction-producing gas is performed subsequent to a semiconductor fabrication step performed on the wafer in the reaction vessel;
   with the reduction-producing gas, forming a reducing plasma in the reaction vessel in proximity with at least a portion of the wafer; and
   utilizing the reducing plasma, stripping at least a portion of the photoresist from the wafer in situ within the semiconductor apparatus.

2. The method of claim 1 applied to a semiconductor fabrication system including plurality of reaction vessels, the semiconductor fabrication step and the stripping being conducted in a single one of the plurality of reaction vessels.

3. The method of claim 1 wherein the flow of reduction-producing gas comprises a mixture of an inert diluent and hydrogen.

4. The method of claim 3, wherein the mixture of inert diluent and hydrogen includes a mixture of about 80% nitrogen to about 20% nitrogen and about 20% hydrogen to about 80% hydrogen.

5. The method of claim 3 wherein flows of hydrogen are from about 150 sccm to about 5000 sccm, and flows of inert diluent comprise flows of nitrogen from about 150 sccm to about 5000 sccm.

6. The method of claim 1 wherein the forming of a reducing plasma further comprises applying RF power to the electrodes of the reaction vessel, the RF power having frequencies in the range of about 100 KHz to about 30 MhZ and power levels of about 150 W to about 5000 W.

7. The method of claim 1 further comprising maintaining wafer area pressures from about 20 mTorr to about 1 Torr.

8. The method of claim 1 further comprising maintaining chamber pressures from about 30 mTorr to about 5 Torr.

9. The method of claim 1 further comprising maintaining bottom electrode temperatures from about −10° C. to about +40° C. during photoresist stripping.

10. The method of claim 9 further comprising applying a flow of wafer backside coolant helium gas at pressures from about 2 Torr to about 15 Torr.

11. The method of claim 10 further for stripping photoresist from a semiconductor wafer subsequent to another semiconductor fabrication process requiring a plasma and a first flow of backside coolant helium gas, the method comprising the further step of adjusting the first flow of backside coolant helium gas to a second flow of backside coolant helium gas at flow rates from about 2 Torr to about 15 Torr, whereby bottom electrode temperatures are maintained at about −10° C. to about +40° C. during photoresist stripping.

12. A method for stripping photoresist from a semiconductor wafer, the wafer including a layer of organosilicate dielectric, the method comprising:
   introducing the wafer into a semiconductor fabrication system including at least one reaction vessel;
   introducing a flow of reduction-producing gas into the reaction vessel;
   with the reduction-producing gas, forming a reducing plasma in the reaction vessel in proximity with at least a portion of the wafer;
   stripping at least a portion of the photoresist from the wafer, utilizing the reducing plasma; and
   maintaining wafer temperature between about −10° C. to about 40° C. during photoresist stripping.

13. The method, as recited in claim 12, wherein the reduction-producing gas comprises an inert diluent and at least about 20% hydrogen.

14. The method, as recited in claim 13, wherein the inert diluent is nitrogen.

15. The method, as recited in claim 12, further comprising the step of performing a semiconductor fabrication step on the wafer in the reaction vessel, subsequent to introducing the wafer into the semiconductor fabrication system and before introducing the flow of reduction-producing gas.

16. A method for stripping photoresist from a semiconductor wafer, the wafer including a layer of organosilicate dielectric, the method comprising:
   introducing the wafer into a semiconductor fabrication system including at least one reaction vessel;
   introducing a flow of reduction-producing gas into the reaction vessel, wherein the reduction producing gas comprises an inert diluent and at least about 20% hydrogen;
   with the reduction-producing gas, forming a reducing plasma in the reaction vessel in proximity with at least a portion of the wafer; and
   stripping at least a portion of the photoresist from the wafer, utilizing the reducing plasma.

17. The method, as recited in claims 16, further comprising the step of performing a semiconductor fabrication step on the wafer in the reaction vessel, subsequent to introducing the wafer into the semiconductor fabrication system and before introducing the flow of reduction-producing gas.

* * * * *